US011815818B2

(12) United States Patent
Johnson et al.

(10) Patent No.: US 11,815,818 B2
(45) Date of Patent: Nov. 14, 2023

(54) METHOD TO ACHIEVE NON-CRYSTALLINE EVENLY DISTRIBUTED SHOT PATTERN FOR DIGITAL LITHOGRAPHY

(71) Applicant: Applied Materials, Inc., Santa Clara, CA (US)

(72) Inventors: Joseph R. Johnson, Redwood City, CA (US); Christopher Dennis Bencher, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/740,750

(22) Filed: May 10, 2022

(65) Prior Publication Data

US 2022/0357670 A1 Nov. 10, 2022

Related U.S. Application Data

(60) Provisional application No. 63/186,585, filed on May 10, 2021.

(51) Int. Cl.
*G03F 7/00* (2006.01)
*G02B 26/10* (2006.01)

(52) U.S. Cl.
CPC ...... *G03F 7/70466* (2013.01); *G03F 7/70191* (2013.01); *G02B 26/105* (2013.01)

(58) Field of Classification Search
CPC .............. G02B 26/105; G03F 7/70191; G03F 7/70466; G03F 7/70275; G03F 7/70433
See application file for complete search history.

(56) References Cited

U.S. PATENT DOCUMENTS

| 8,351,020 | B2 * | 1/2013 | Sandstrom | G06K 17/00 355/77 |
| 10,416,550 | B2 * | 9/2019 | Johnson | G03F 7/70433 |
| 2006/0190224 | A1 * | 8/2006 | Allen | G06F 30/398 703/2 |
| 2007/0109320 | A1 * | 5/2007 | Skibak | G06T 11/001 345/611 |
| 2011/0219344 | A1 * | 9/2011 | Heng | G06F 30/00 716/108 |
| 2013/0314682 | A1 * | 11/2013 | Kemmoku | G03G 15/043 355/68 |
| 2020/0004132 | A1 * | 1/2020 | Johnson | G03F 7/70275 |
| 2020/0301288 | A1 | 9/2020 | Johnson et al. | |
| 2022/0326616 | A1 * | 10/2022 | Bencher | G03F 7/2057 |
| 2022/0357665 | A1 * | 11/2022 | Johnson | G03F 7/7055 |

FOREIGN PATENT DOCUMENTS

WO WO-2021115766 A1 * 6/2021 ............... G03F 1/36

OTHER PUBLICATIONS

Roberts, Dr. Martin, "A New Method to Construct Isotropic Blue-Noise Sample Point Sets with Uniform Projections", Extreme Learning article, retrieved Feb. 22, 2021, 23 pages.

* cited by examiner

*Primary Examiner* — Deoram Persaud
(74) *Attorney, Agent, or Firm* — Servilla Whitney LLC

(57) ABSTRACT

Methods for patterning a substrate are described. A substrate is scanned using a spatial light modulator with a plurality of exposures timed according to a non-crystalline shot pattern. Lithography systems for performing the substrate patterning method and non-transitory computer-readable medium for executing the patterning method are also described.

20 Claims, 9 Drawing Sheets

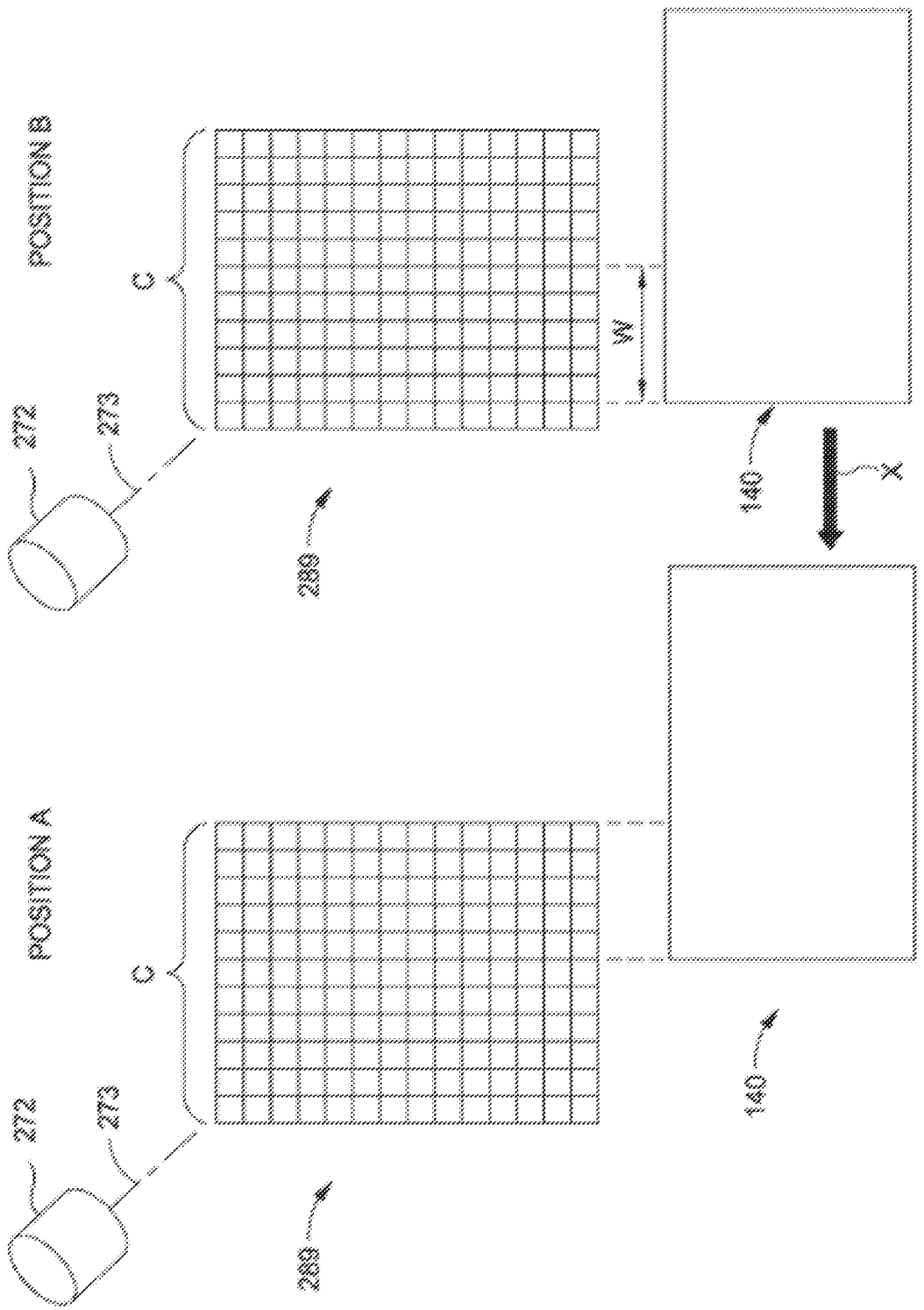

METHOD TO ACHIEVE NON-CRYSTALLINE EVENLY DISTRIBUTED SHOT PATTERN FOR DIGITAL LITHOGRAPHY

CROSS-REFERENCE TO RELATED APPLICATIONS

This application claims priority to U.S. Provisional Application No. 63/186,585, filed May 10, 2021, the entire disclosure of which is hereby incorporated by reference herein.

TECHNICAL FIELD

Embodiments of the present disclosure generally relate to apparatuses, systems and methods for processing one or more substrates. In particular, embodiments of the disclosure are directed to apparatuses, systems and methods for performing photolithography processes. More specifically, one or more embodiments of the disclosure relate to improved apparatuses, systems and methods for providing evenly distributed lithography patterning.

BACKGROUND

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels include a layer of liquid crystal material forming pixels sandwiched between two plates. When power from a power supply is applied across the liquid crystal material, an amount of light passing through the liquid crystal material is controlled at pixel locations enabling images to be generated.

Microlithography techniques have been employed to create electrical features incorporated as part of the liquid crystal material layer forming the pixels. According to these techniques, a light-sensitive photoresist is applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features.

Present shot patterning use a Hex Close Pack (HCP) orientation, as shown in FIG. 1A. The HCP has inherent lines of symmetry which result in printed shapes with scalloped edges. Printed or etched shapes that have angles close to the HCP lines of symmetry result in edge placement errors and/or line scalloping, as shown in FIG. 1B.

Accordingly, there is a need in the art for apparatuses, systems and methods that improve edge uniformity and/or reduce the effect of lines of symmetry.

SUMMARY

One or more embodiments of the disclosure are directed to methods for patterning a substrate. The methods comprise generating a non-crystalline shot pattern and scanning the substrate with a spatial light modulator using a plurality of exposures timed according to the non-crystalline shot pattern.

Additional embodiments of the disclosure are directed to lithography systems comprising: a stage to move a substrate past a spatial light modulator; and a controller configured to scan the substrate with the spatial light modulator using a plurality of light exposures timed according to the non-crystalline shot pattern.

Further embodiments of the disclosure are directed to non-transitory computer-readable medium having instructions that are configured to cause a system to: determine a non-crystalline shot pattern; and scan a substrate with a spatial light modulator using a plurality of exposures timed according to the non-crystalline shot pattern, the spatial light modulator comprising a plurality of light emitters.

BRIEF DESCRIPTION OF THE DRAWINGS

So that the manner in which the recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 4 is a schematic view of a digital micromirror device according to embodiments disclosed herein;

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

One or more embodiments of the disclosure advantageously provide apparatus and/or methods for printing/lithography that allows for even shot/light distribution on substrates without formation of crystalline patterns.

Embodiments of the present disclosure generally provide improved photolithography systems and methods using a digital micromirror device (DMD). The DMD has a plurality of individually addressable mirrors which may be referred to as pixels. The DMD comprises a plurality of micromirrors arranged into an array of columns and rows. The DMD is disposed opposite a substrate and arranged so that light beams reflect off the micromirrors onto the substrate, resulting in a patterned substrate.

Figure 1A:
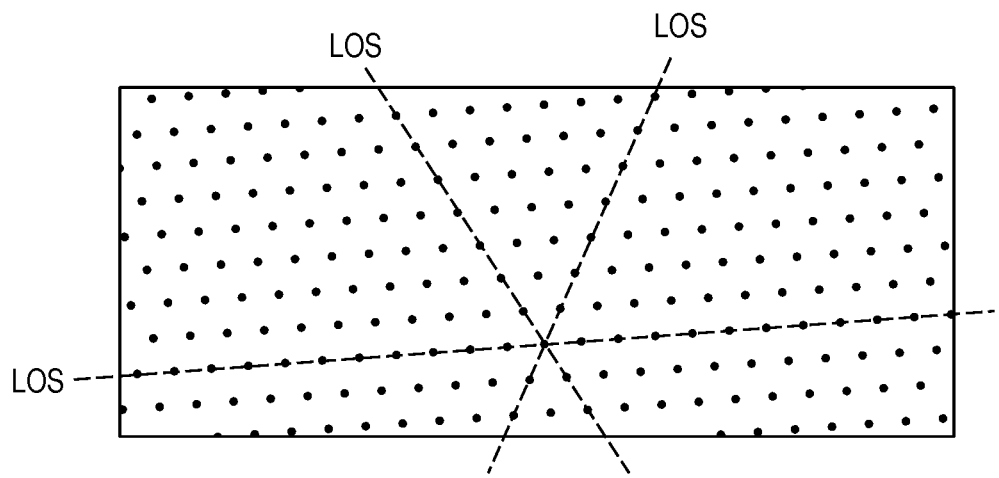
FIG. 1A shows a schematic representation of a Hex Close Pack (HCP) shot pattern.
Figure 1B:
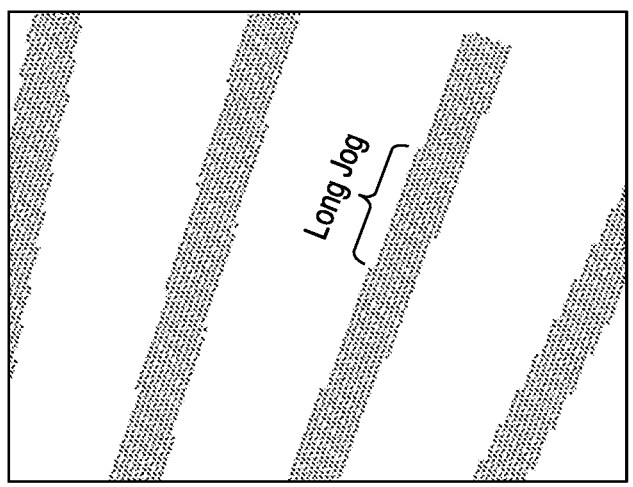
FIG. 1B shows a schematic representation of line scalloping due to the HCP of FIG. 1A.
Figure 2A:
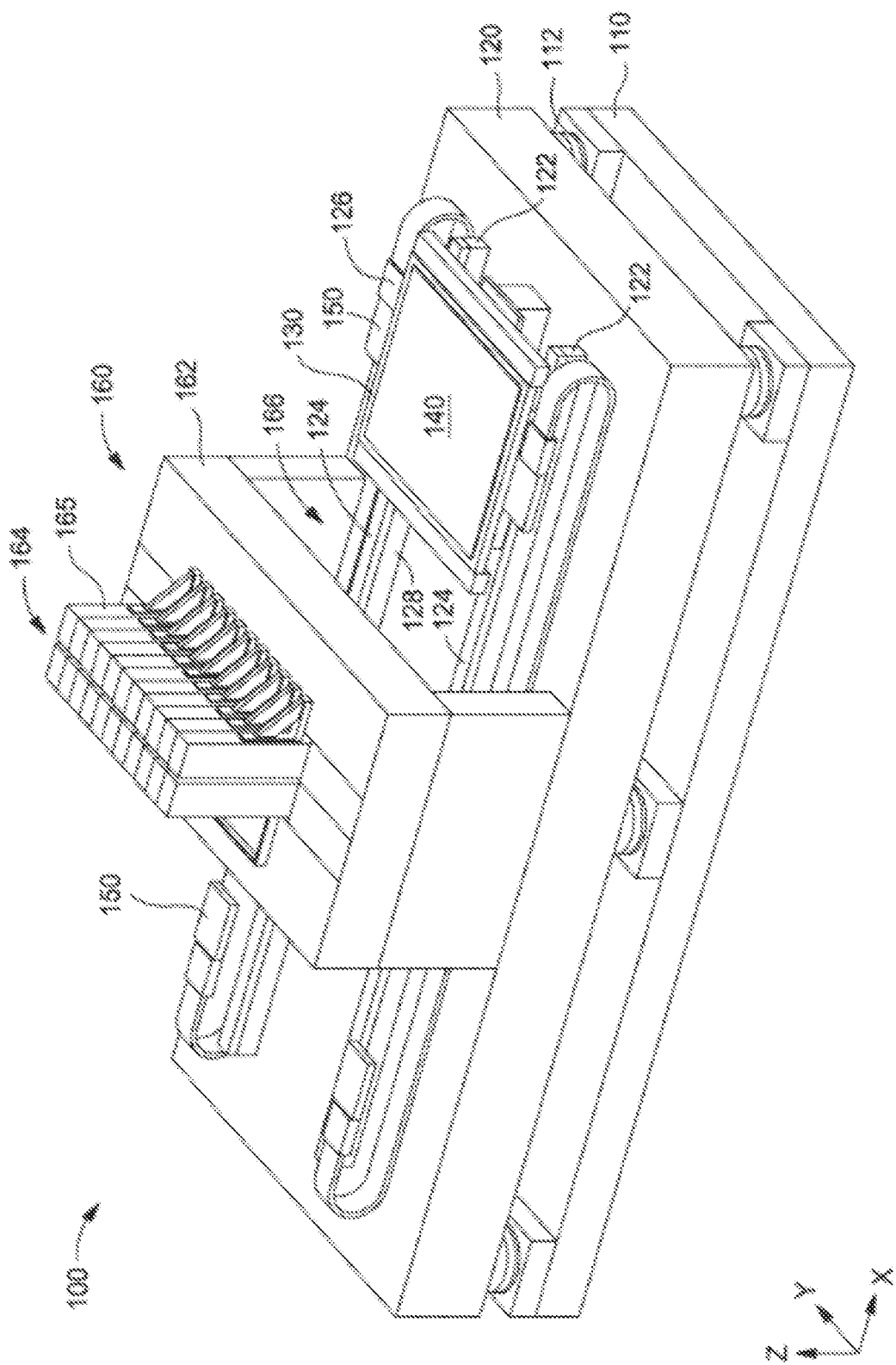
FIG. 2A is a perspective view of a photolithography system according to embodiments disclosed herein.

FIG. 2A is a perspective view of a photolithography system 100 according to one or more embodiments of the disclosure. The system 100 includes a base frame 110, a slab 120, a stage 130, and a processing apparatus 160. The base frame 110 rests on the floor of a fabrication facility and supports the slab 120. Passive air isolators 112 are positioned between the base frame 110 and the slab 120. In some embodiments, the slab 120 is a monolithic piece of granite, and the stage 130 is disposed on the slab 120.

A substrate 140 is supported by the stage 130. A plurality of holes (not shown) are formed in the stage 130 to allow a plurality of lift pins (not shown) to extend therethrough. In some embodiments, the lift pins rise from a process position to an extended or loading/unloading position to receive the substrate 140, such as from one or more transfer robots (not shown). The one or more transfer robots are used to load and unload a substrate 140 from the stage 130.

The substrate 140 comprises any suitable material, for example, quartz used as part of a flat panel display. In other embodiments, the substrate 140 is made of other materials. In some embodiments, the substrate 140 has a photoresist layer formed thereon. A photoresist is sensitive to radiation. A positive photoresist includes portions of the photoresist, which when exposed to radiation, will be respectively soluble to photoresist developer applied to the photoresist after the pattern is written into the photoresist. A negative photoresist includes portions of the photoresist, which when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, diazonaphthoquinone, phenol formaldehyde resin, poly(methyl methacrylate), poly(methyl glutarimide) and/or SU-8. In this manner, the pattern is created on a surface of the substrate 140 to form the electronic circuitry.

The system 100 illustrated in FIG. 2A includes a pair of supports 122 and a pair of tracks 124. The pair of supports 122 are disposed on the slab 120, and the slab 120 and the pair of supports 122 are a single piece of material. The pair of tracks 124 are supported by the pair of the supports 122, and the stage 130 moves along the tracks 124 in the X-direction. In some embodiments, the pair of tracks 124 is a pair of parallel magnetic channels. As shown, each track 124 of the pair of tracks 124 is linear. In other embodiments, one or more track 124 is non-linear. In some embodiments, an encoder 126 is coupled to the stage 130 in order to provide location information to a controller (not shown).

The processing apparatus 160 in the illustrated embodiment includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatus (shown in FIGS. 2A and 2B). In one embodiment, the processing unit 164 contains as many as 84 image projection apparatus. Each image projection apparatus is disposed in a case 165. The processing apparatus 160 is useful to perform maskless direct patterning.

During operation, the stage 130 moves in the X-direction from a loading position, as shown in FIG. 2A, to a processing position. The processing position is one or more positions of the stage 130 as the stage 130 passes under the processing unit 164. In some embodiments, during operation, the stage 130 is lifted by a plurality of air bearings (not shown) and moves along the pair of tracks 124 from the loading position to the processing position. In one or more embodiments, a plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

In one or more embodiments, a metrology system measures the X and Y lateral position coordinates of each of the stage 130 in real time so that each of the plurality of image projection apparatus can accurately locate the patterns being written in a photoresist covered substrate. The metrology system also provides a real-time measurement of the angular position of each of the stage 130 about the vertical or Z-axis. The angular position measurement can be used to hold the angular position constant during scanning by means of a servo mechanism or it can be used to apply corrections to the positions of the patterns being written on the substrate 140 by the image projection apparatus 270, shown in FIGS. 3A-3B. These techniques may be used in combination.

Figure 2B:
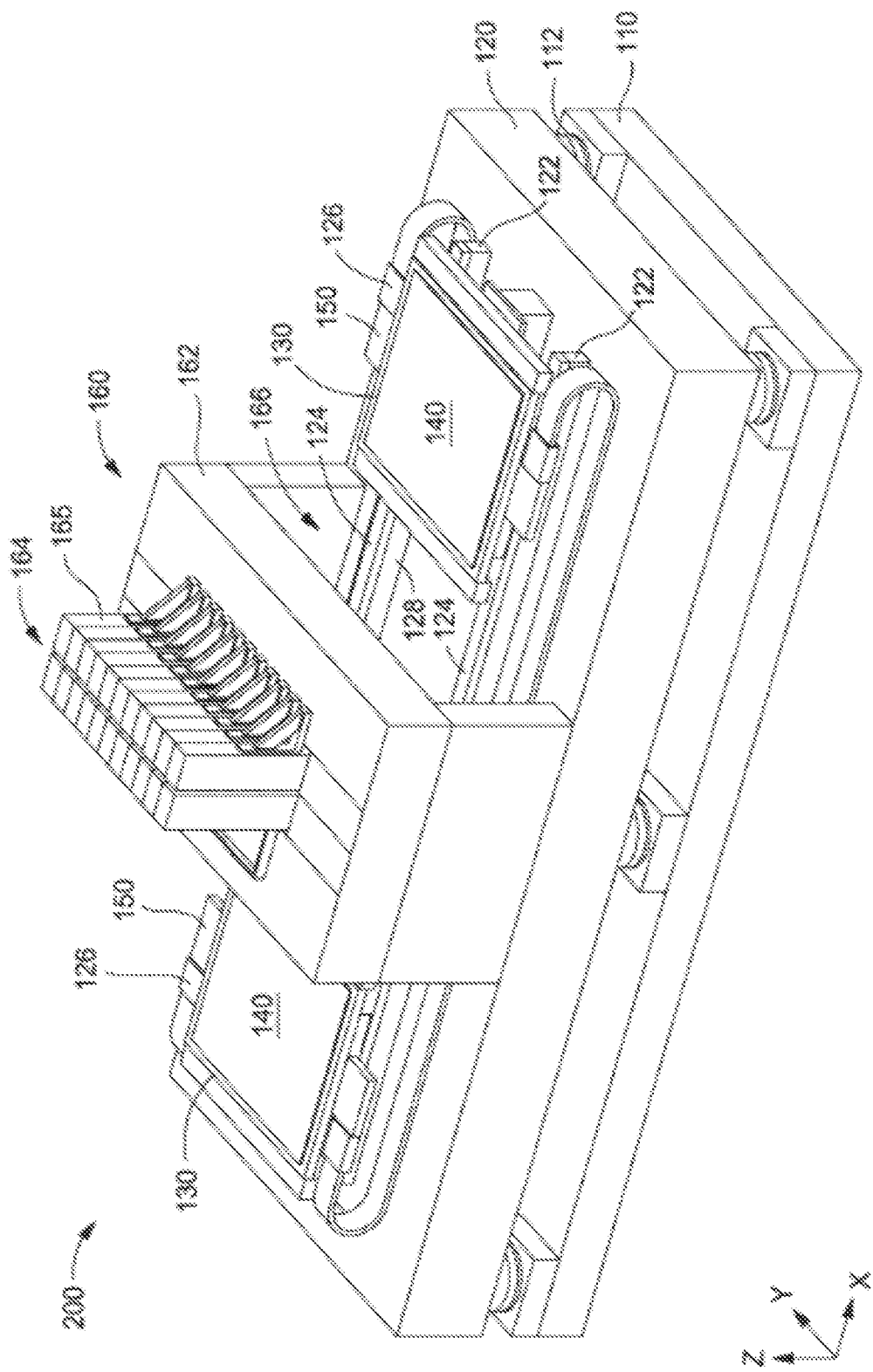
FIG. 2B is a perspective view of a photolithography system according to embodiments disclosed herein.

FIG. 2B is a perspective view of a photolithography system 200 according to embodiments disclosed herein. The system 200 is similar to the system 100 with the inclusion of a second stage 130. Each of the stages 130 is capable of independent operation and can scan a substrate 140 in one direction and step in the other direction. In some embodiments, when one of the two stages 130 is scanning a substrate 140, another of the two stages 130 is unloading an exposed substrate and loading the next substrate to be exposed.

While FIGS. 2A-2B depict two embodiments of a photolithography system, other systems and configurations are also contemplated herein. For example, photolithography systems including any suitable number of stages are also contemplated.

Figure 3A:
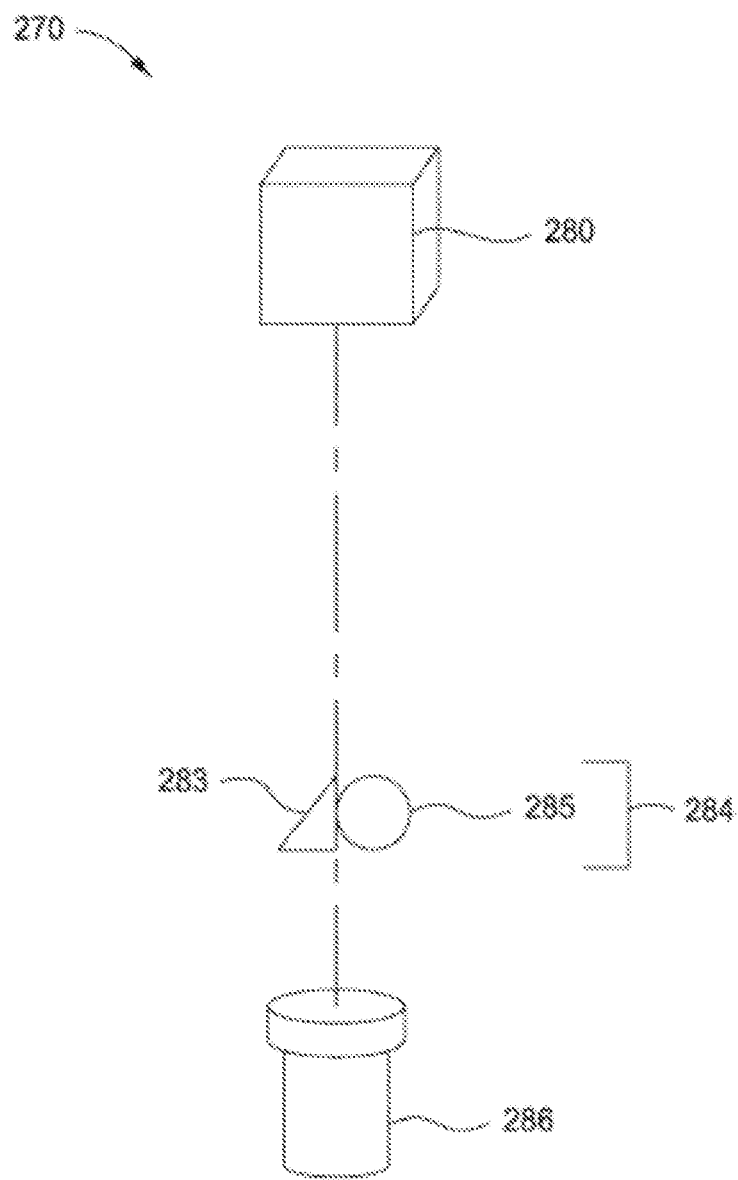
FIG. 3A is a perspective schematic view of an image projection apparatus according to embodiments disclosed herein.

FIG. 3A is a schematic view of an image projection apparatus 270 according to one or more embodiment. The image projection apparatus 270 of some embodiments is useful for a photolithography system, such as system 100 or system 200. The image projection apparatus 270 illustrated includes one or more spatial light modulators 280, an alignment and inspection system 284 including a focus sensor 283 and a camera 285, and projection optics 286. The components of image projection apparatus 270 can vary depending on, for example, the spatial light modulator 280 employed. Spatial light modulators 280 include, but are not limited to, microLEDs, VCSELs, any solid-state emitters of electromagnetic radiation, digital micromirror devices (DMDs) and liquid crystal displays (LCDs).

In operation, the spatial light modulator 280 is used to modulate one or more properties of the light, such as amplitude, phase, or polarization, which is projected through the image projection apparatus 270 to a substrate. The alignment and inspection system 284 is used for alignment and inspection of the components of the image projection apparatus 270. In some embodiments, the focus sensor 283 includes a plurality of lasers which are directed through the lens of the camera 285 and back through the lens of the camera 285 and imaged onto sensors to detect whether the image projection apparatus 270 is in focus. The camera 285 is used to image the substrate, such as substrate 140, to ensure the alignment of the image projection apparatus 270 and photolithography system 100 or 200 is correct or within a predetermined tolerance. The projection optics 286, such as one or more lenses, is used to project the light onto the substrate, such as the substrate 140.

Figure 3B:
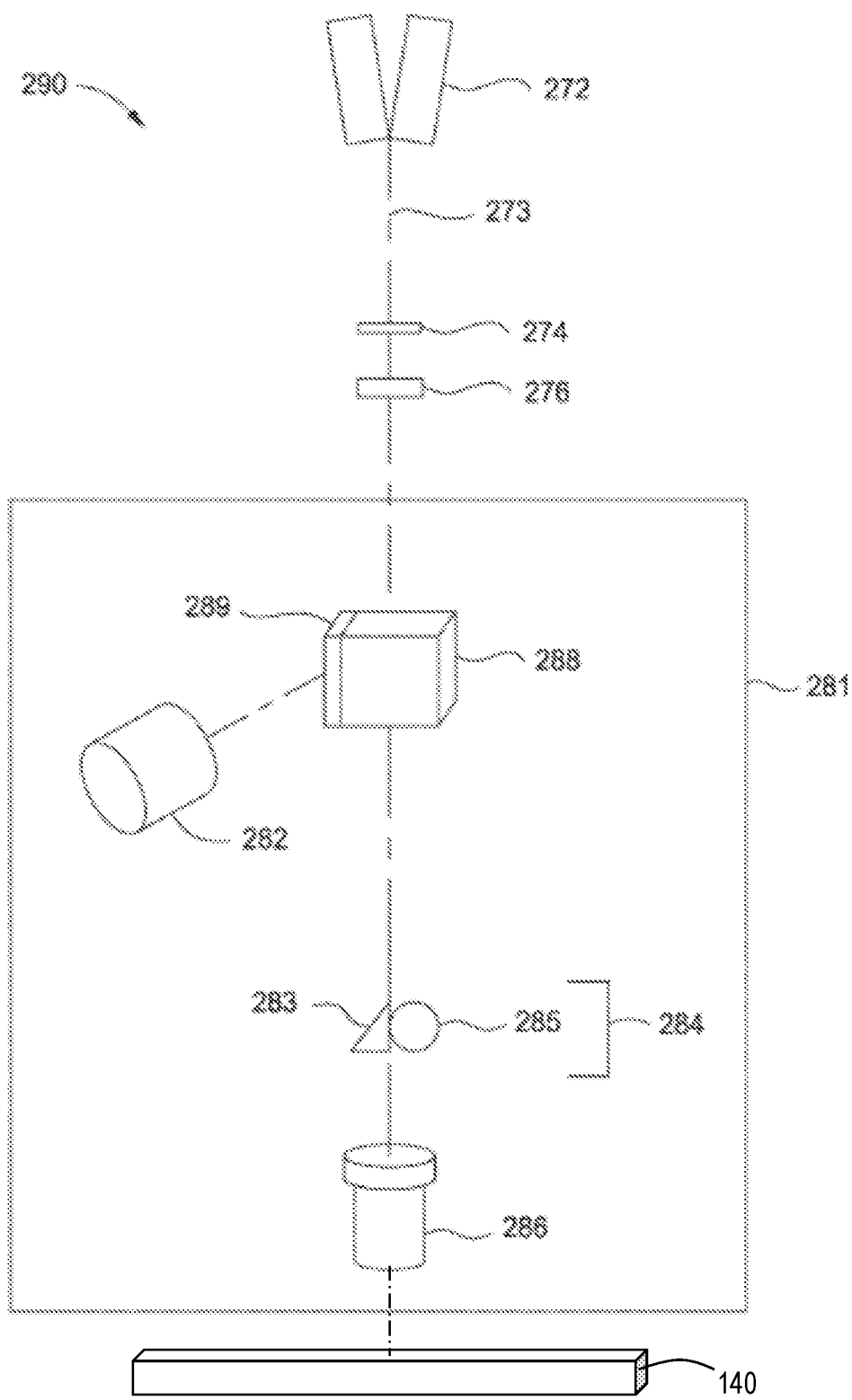
FIG. 3B is a perspective schematic view of an image projection apparatus according to embodiments disclosed herein.

FIG. 3B is an image projection apparatus 281 according to one or more embodiments of the disclosure. In the embodiment shown in FIG. 3B, the image projection apparatus 281 uses one or more DMDs 289 as the spatial light modulator(s). The image projection apparatus 281 is part of an image projection system 290, which includes a light source 272, an aperture 274, a lens 276, a frustrated prism assembly 288, one or more DMDs 289 (one is shown), and a light dump 282, in addition to the alignment and inspection system 284 and the projection optics 286. The light source 272 is any suitable light source, such as a light emitting diode (LED) or a laser, capable of producing a light having predetermined wavelength. In one embodiment, the predetermined wavelength is in the blue or near ultraviolet (UV) range, such as less than about 450 nm. The frustrated prism assembly 288 includes a plurality of reflective surfaces. The projection lens 286 is, as an example, a 10× objective lens. During operation of the image projection apparatus 281 shown in FIG. 2B, a light beam 273 having a predetermined wavelength, such as a wavelength in the blue range, is produced by the light source 272. The light beam 273 is reflected to the DMD 289 by the frustrated prism assembly 288. The DMD 289 includes a plurality of mirrors, and the number of mirrors corresponds to the number of pixels to be projected. The plurality of mirrors are individually controllable, and each mirror of the plurality of mirrors is at an "on" position or "off" position, based on the mask data provided to the DMD 289 by the controller (not shown). When the light beam 273 reaches the mirrors of the DMD 289, the mirrors that are at "on" position reflect the light beam 273, i.e., forming the plurality of write beams, to the projection lens 286. The projection lens 286 then projects the write beams to the surface of the substrate 140. The mirrors that are at "off" position reflect the light beam 273 to the light dump 282 instead of the surface of the substrate 140.

In some cases, errors may occur that introduce uniformity errors across the field. For example, the light beam 273 that projects onto the mirrors of the DMD 289 may have some errors such that a higher intensity light projects onto one area of the DMD 289 and a lower intensity light projects onto another area of the DMD 289. As a result, the plurality of write beams projected to the surface of the substrate 140 may incorporate uniformity errors such that more light is projected in one area of the surface of the substrate 140 and less light is projected in another area of the surface of the substrate 140. Embodiments in the present disclosure improve methods and devices to reduce these uniformity errors.

FIG. 4 is a schematic view of a substrate 140 traveling relative to a DMD 289. The mirrors of the DMD 289 are arranged in rows and columns. The total number of columns of mirrors of the DMD 289 is represented by the letter C. The substrate 140 moves at a certain velocity relative to the DMD 289. Similarly, the light beam 273 flashes from light source 272 at a regular interval. The substrate 140 moves at a rate such that between flashes of the light beam 273, the substrate 140 travels a distance W in the X direction relative to the DMD 289. The distance W corresponds to a number of columns Q of mirrors of the DMD 289. The total number of exposures taken as the DMD 289 scans the entire substrate 140 one time is represented by the letter T. The total number of columns C of mirrors of the DMD 280 divided by the total number of exposures T taken during a single scan equals the number of columns Q traveled by the DMD 280 during a single interval.

One or more embodiments of the disclosure are directed to methods for patterning a substrate. The methods comprise generation of a non-crystalline shot pattern for scanning the substrate. As used in this manner, the term "crystalline" means that the shot pattern distribution has regular intervals between shots, or a linear relationship of the shots. A "non-crystalline" shot pattern is randomized so that there are less likelihood of formation of long jogs resulting from linear shot relationships.

Figure 5A:
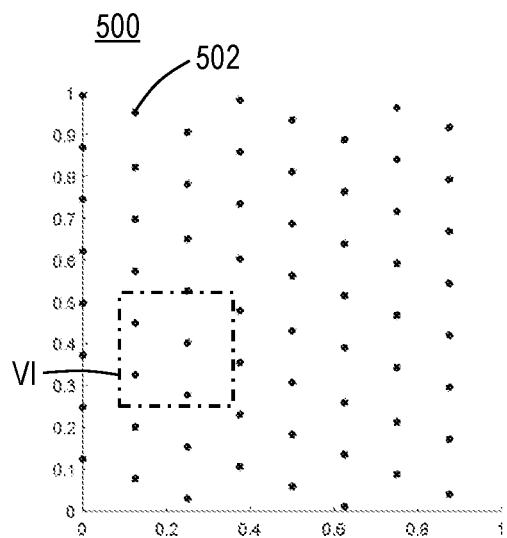
FIGS. 5A through 5H illustrate a method of forming a non-crystalline shot pattern according to one or more embodiments.

FIG. 5A illustrates a typical crystalline shot pattern 500. While the spacing of the shots 502 is not limiting, the illustrated embodiment shows a pattern with about an 0.13 μm pitch. Each of the dots shown represents an exposure point for the lithography system. When one of the mirrors from the DMD lands on a region where exposure should occur, the lithography system fires the laser. This exposure is represented by the dots in shot pattern 500. The embodiment in FIG. 5A is a known distribution of shots. While the known distribution of shots in the illustrated embodiment is a Hexagonal-Close-Packed (HCP) shot pattern, the skilled artisan will recognize that the disclosure is not limited to HCP shot patterns, and that other shot patterns (e.g., orthogonal shot patterns, patterns slightly off of HCP) are within the scope of the disclosure.

The crystalline shot pattern 500 of FIG. 5A is subjected to a first jitter process where a shot jitter is added to each of the shots of the HCP. The first jitter results in movement of the shot in one or more of the X-axis or Y-axis directions to generate a jittered shot pattern 510.

The first jitter results in movement of the shots 502 randomly by a jitter amount. In some embodiments, the jitter amount is a percentage of the pitch. In some embodiments, the jitter amount for each shot 502 is independently up to ±33% of the pitch. In some embodiments, the jitter amount is sufficient to prevent adjacent shots from crossing. For example, if a first shot were to move more than halfway toward an adjacent second shot, and the adjacent second shot were to move more than halfway toward the first shot, the first shot and adjacent second shot would switch places resulting in excessive and unnecessary displacement. In some embodiments, the jitter amount for each shot is independently ±50%, ±45%, ±40%, ±35%, ±30%, ±25%, ±20%, ±15%, ±10% or ±5%.

Figure 5B:
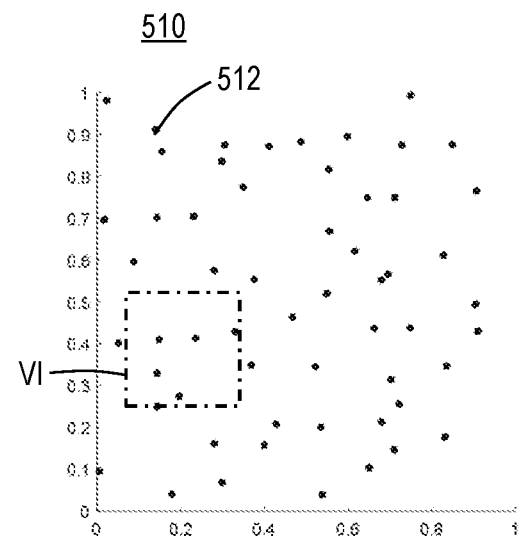

Each of the shots 512 in the jittered shot pattern 510 has corresponding coordinates in the X-axis and Y-axis directions. FIGS. 6A through 6E show an expanded view of region VI in FIGS. 5A through 5C. FIG. 6A illustrates the region VI of the crystalline shot pattern 500 showing five shots 512a-e. Vector arrows show the jitter movement from FIG. 6A to FIG. 6B. As illustrated, shot 512d barely moving, shot 512 moving outside of region VI, and shot 512f moving into the region VI, as shown in FIG. 6B.

Figure 5C:
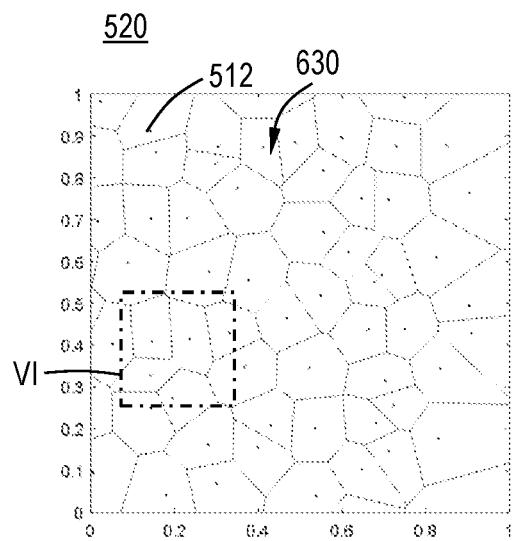
Figure 6A:
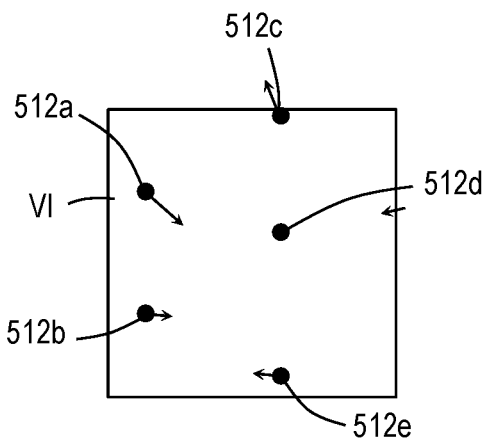
FIGS. 6A through 6E illustrate an expanded view of region VI from FIGS. 5A through 5C.
Figure 6B:
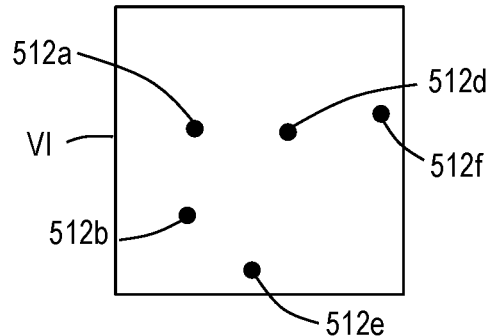
Figure 6C:
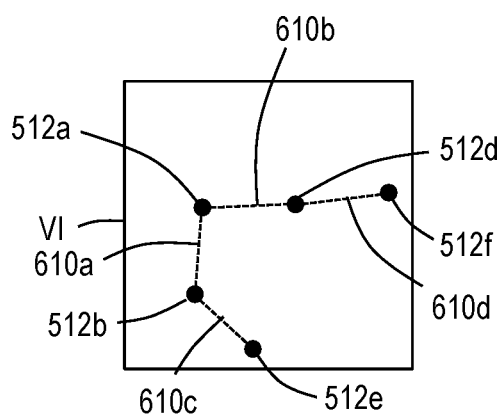
Figure 6D:
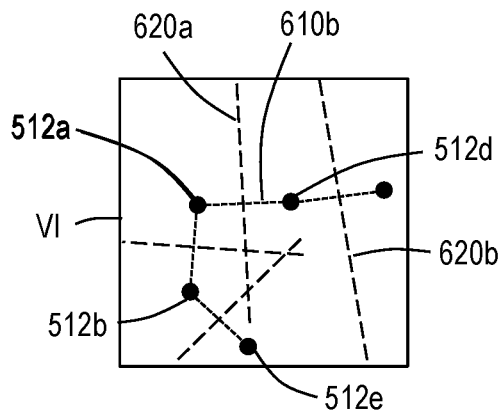
Figure 6E:
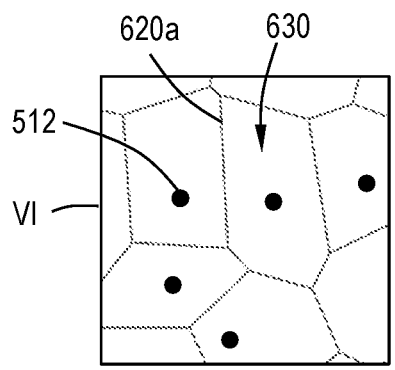

FIG. 5C shows the jittered shot pattern 510 after formation of Voronoi cells 520. The Voronoi cells are generated by determining the spacing between each adjacent shot 512 and calculating a line that extends tangentially to the mid-point of a line between the adjacent shots. Each of the tangential lines terminates upon contact with another tangent line. FIGS. 6C through 6E show the formation of the Voronoi cells in region VI. In FIG. 6C, each of the jittered shots 512a-e are connected with a line to the adjacent shots. Shot 512a is connected to 512b with line 610a, shot 512a is connected to shot 512d with line 610b, shot 512b is connected to shot 512e with line 610c, and shot 512d is connected to shot 512f with line 610d. For clarity, the connection lines between shot 510d and 510c, 510b and 510c, etc., are omitted from the drawing.

In FIG. 6D, a perpendicular line 620a, 620b is drawn crossing each of lines 610a, 610b, 610c and 610d. For illustrative purposes, only two of the perpendicular lines are numbered. Each of the perpendicular lines 620a, 620b are equidistant from the shots used to generate the line. In FIG. 6E, the Voronoi cells 630 are drawn using the perpendicular lines from FIG. 6D. Each side of the Voronoi cells 630 are determined by the points where the perpendicular lines meet. The skilled artisan will recognize that the Voronoi cells can be calculated with or without drawing the separate lines and intersections.

Figure 5D:
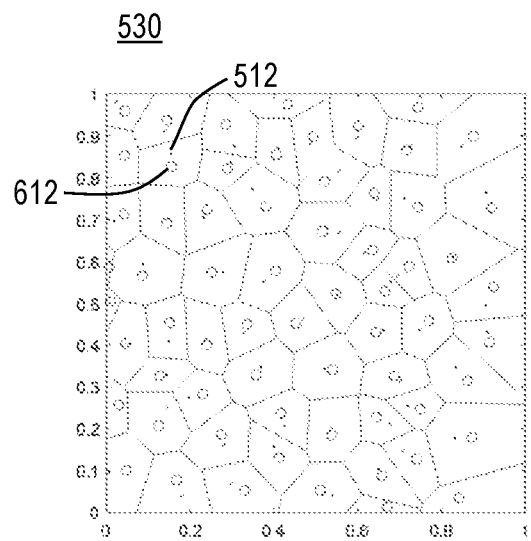
Figure 5E:
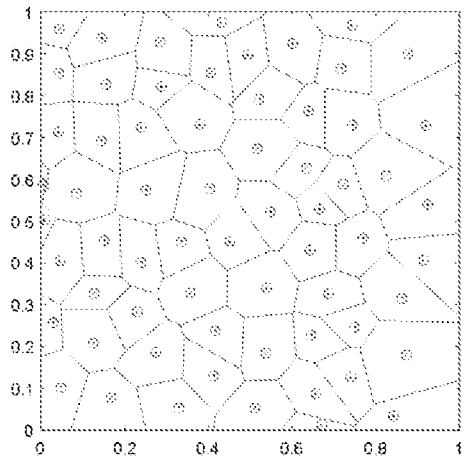
Figure 5F:
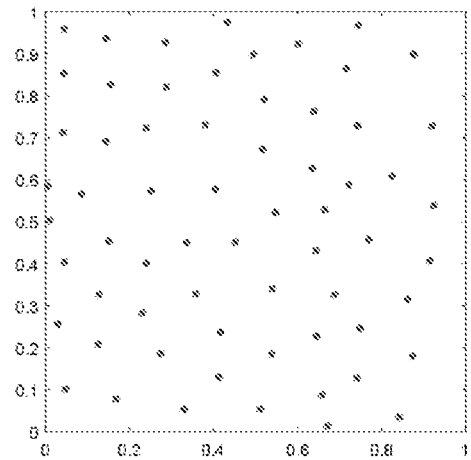

FIGS. 5D through 5F show the Voronoi cells 630 generated in FIGS. 5C and 6E after moving the coordinates of each shot 512 of the jittered shot pattern 510 to a corresponding centroid of each of the Voronoi cells to generate a non-crystalline shot pattern 550. The moved shot 512 is numbered 612. In FIG. 5D, shot 512 is shown in the original position as a dot and in the centered position as a circle. FIG. 5E shows a view 540 with the shots 512, 612 at the center of the Voronoi cells 630. In FIG. 5F, the lines of the Voronoi cells 630 are removed, completing 1 cycle of the Voronoi iteration leaving the non-crystalline pattern 550. Again, the skilled artisan will recognize that the lines and dots do not need to be drawn. The shot pattern of some embodiments is stored as a collection of coordinates which can be used by a lithography system. The skilled artisan will recognize that the description of the process for forming Voronoi cells is merely representative of one possible method and the cells can be generated by other processes and mathematical constructs.

Figure 5G:
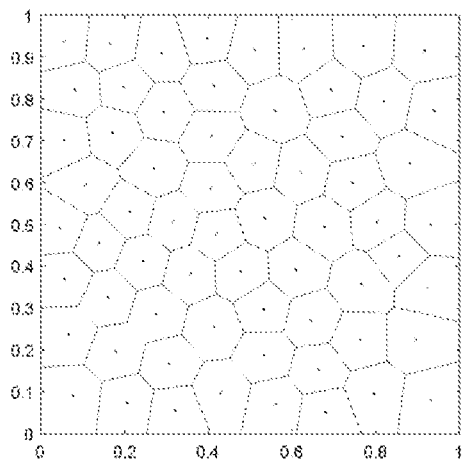
Figure 5H:
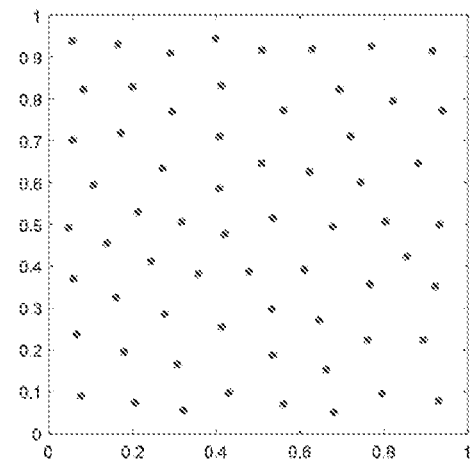

FIG. 5G shows Voronoi cells 630 generated starting from the non-crystalline shot pattern 550 of FIG. 5F. The Voronoi cells are determined using newly computed Voronoi cell centroids. The coordinates of each of the shots is moved to the corresponding centroid of each of the subsequent Voronoi cells in view 560 to generate a refined non-crystalline shot pattern 570 shown in FIG. 5H.

In some embodiments, the non-crystalline shot pattern is generated using the Voronoi iteration one time. In some embodiments, the non-crystalline shot pattern is generated by repeating the Voronoi iteration in the range of 2 to 50 times, with each cycle of the Voronoi iteration beginning with the non-crystalline shot pattern from the previous Voronoi iteration cycle.

After generating the non-crystalline shot pattern, the substrate is scanned using a spatial light modulator with a plurality of exposure timed according to the non-crystalline shot pattern. As used in this manner, exposure timing is modified slightly for each shot based on the magnitude and direction of displacement from its original position.

In some embodiments, the spatial light modulator comprises a digital micromirror device (DMD). In some embodiments, the DMD has a mirror pitch in the range of 0.5 µm to 4 µm as seen at the substrates. In one or more embodiments, a shot occurs when a designated subset of mirrors of the DMD are angled to direct reflected light onto the substrate. Stated differently, the shot of some embodiments occurs in a manner coordinated with control of the DMD mirrors. In some embodiments, the designated subset of mirrors of the DMD are directed to reflect light toward the substrate and a designated subset of mirrors of the DMD are angled to direct light to a light dump. The combination of mirror control and shot pattern timing generate a pattern on the substrate.

The non-crystalline shot pattern of some embodiments generates a more homogeneous arrangement of shots and a more uniform pattern. In some embodiments, scanning the substrate with the non-crystalline shot pattern is slower than scanning with a crystalline shot pattern (e.g., the HCP shot pattern). In some embodiments, scanning the substrate with the non-crystalline shot pattern is in the range of 10 to 25% slower than the HCP shot pattern.

The pitch of the mirrors at the substrate of some embodiments is in the range of 0.5 to 4.0 µm or in the range of 1.0 to 1.5 µm. The shot pitch is the pitch between exposure locations on the substrate (i.e., the distance between the HCP dots). A non-crystalline pattern does not have a shot pitch because the dots are unevenly spaced.

Referring again to FIGS. 2A to 3B, additional embodiments of the disclosure are directed to lithography systems comprising a stage 130 to move a substrate past a spatial light modulator 280 and a controller. The controller is configured to scan the substrate with the spatial light modulator using a plurality of light exposures timed according to the non-crystalline shot pattern.

At least one controller is coupled to one or more of the stage 130, the processing unit 164, the spatial light modulator 280 and/or light source 272. In some embodiments, there are more than one controller connected to the individual components and a primary control processor is coupled to each of the separate processors to control the system. The controller may be one of any form of general-purpose computer processor, microcontroller, microprocessor, etc., that can be used in an industrial setting for controlling various components and sub-processors.

The at least one controller can have a processor, a memory coupled to the processor, input/output devices coupled to the processor, and support circuits for communication between the different electronic components. The memory can include one or more of transitory memory (e.g., random access memory) and non-transitory memory (e.g., storage).

The memory, or computer-readable medium, of the processor may be one or more of readily available memory such as random access memory (RAM), read-only memory (ROM), floppy disk, hard disk, or any other form of digital storage, local or remote. The memory can retain an instruction set that is operable by the processor to control parameters and components of the system. The support circuits are coupled to the processor for supporting the processor in a conventional manner. Circuits may include, for example, cache, power supplies, clock circuits, input/output circuitry, subsystems, and the like.

Processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware.

The software routine, when executed by the processor, transforms the general purpose computer into a specific purpose computer (controller) that controls the chamber operation such that the processes are performed.

In some embodiments, the controller has one or more configurations to execute individual processes or sub-processes to perform the method. The controller can be connected to and configured to operate intermediate components to perform the functions of the methods. For example, the controller can be connected to and configured to control one or more of gas valves, actuators, motors, slit valves, vacuum control, etc.

The controller of some embodiments has one or more configurations selected from one or more of a configuration to move a substrate on sample stage, a configuration to control the mirrors of the DMD, a configuration to control the light source and/or a configuration to determine a non-crystalline shot pattern.

While the foregoing is directed to examples of the present disclosure, other and further examples of the disclosure may be devised without departing from the basic scope thereof, and the scope thereof is determined by the claims that follow.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method for patterning a substrate, the method comprising:
    generating a non-crystalline shot pattern; and
    scanning the substrate with a spatial light modulator using a plurality of exposures timed according to the non-crystalline shot pattern.

2. The method of claim 1, wherein the non-crystalline shot pattern is generated by a method comprising:
    adding a shot jitter to a known distribution of shots to generate a jittered shot pattern, each shot of the jittered shot pattern having corresponding coordinates;
    determining Voronoi cells from the jittered shot pattern; and
    moving the coordinates of each shot of the jittered shot pattern to a corresponding centroid of each of the Voronoi cells to generate the non-crystalline shot pattern.

3. The method of claim 2, wherein generating the non-crystalline shot pattern further comprises repeating a Voronoi iteration at least one time, the Voronoi iteration comprising determining new Voronoi cells from the previously generated centroids; moving the coordinates of each shot location computed from the previously generated centroids to a corresponding centroid of each newly computed Voronoi cells to generate a refined non-crystalline shot pattern.

4. The method of claim 3, wherein the Voronoi iteration is repeated in the range of 2 to 50 times.

5. The method of claim 2, wherein the shot jitter is up to ±35% of the shot pitch.

6. The method of claim 1, wherein the spatial light modulator comprises a digital micromirror device (DMD).

7. The method of claim 6, wherein the pitch of the mirrors of the DMD at the substrate is in the range of 0.5 to 4.0 µm.

8. The method of claim 6, wherein scanning the substrate with the non-crystalline shot pattern is in the range of 10 to 25% slower than a hexagonal-close-packed (HCP) shot pattern.

9. The method of claim 6, wherein the DMD has a mirror pitch at the substrate in the range of 0.5 µm to 5 µm.

10. The method of claim 9, wherein a designated subset of mirrors of the DMD are angled to direct light to a light dump.

11. The method of claim 6, wherein when a shot occurs, a designated subset of mirrors of the DMD are angled to direct reflected light onto the substrate.

12. A lithography system comprising:
    a stage to move a substrate past a spatial light modulator; and
    a controller configured to scan the substrate with the spatial light modulator using a plurality of light exposures timed according to a non-crystalline shot pattern.

13. The lithography system of claim 12, wherein the controller is configured to determine the non-crystalline shot pattern from a known distribution of shots.

14. The lithography system of claim 13, wherein the non-crystalline shot pattern is generated by a method comprising:
    adding a shot jitter to the known distribution of shots to generate a jittered shot pattern, each shot of the jittered shot pattern having corresponding coordinates;
    determining Voronoi cells from the jittered shot pattern;
    moving the coordinates of each shot of the jittered shot pattern to a corresponding centroid of each of the Voronoi cells to generate a refined crystalline shot pattern.

15. The lithography system of claim 14, wherein generating the non-crystalline shot pattern further comprises repeating a Voronoi iteration at least one time, the Voronoi iteration comprising adding a shot jitter to the non-crystalline shot pattern to generate a new jittered shot pattern, determining new Voronoi cells from the new jittered shot pattern; moving the coordinates of each shot of the new jittered shot pattern to a corresponding centroid of each of the newly computed Voronoi cells to generate a new non-crystalline shot pattern.

16. The lithography system of claim 15, wherein the Voronoi iteration is repeated in the range of 2 to 50 times.

17. The lithography system of claim 12, wherein the spatial light modulator comprises a digital micromirror device (DMD).

18. The lithography system of claim 17, wherein the DMD has a mirror pitch at the substrate in the range of 1 µm to 1.5 µm.

19. A non-transitory computer-readable medium having instructions that are configured to cause a system to:

determine a non-crystalline shot pattern; and scan a substrate with a spatial light modulator using a plurality of exposures timed according to the non-crystalline shot pattern, the spatial light modulator comprising a plurality of light emitters.

20. The non-transitory computer-readable medium of claim 19, wherein the non-crystalline shot pattern is generated by a method comprising:

adding a shot jitter to a known distribution of shots to generate a jittered shot pattern, each shot of the jittered shot pattern having corresponding coordinates;

determining Voronoi cells from the jittered shot pattern; and moving the coordinates of each shot of the jittered shot pattern to a corresponding centroid of each of the Voronoi cells to generate a refined crystalline shot pattern.

* * * * *